(12) United States Patent
Hagerott et al.

(10) Patent No.: US 6,876,942 B2
(45) Date of Patent: Apr. 5, 2005

(54) METHODS AND SYSTEMS FOR ENHANCED AUTOMATED SYSTEM TESTING

(75) Inventors: Steven G. Hagerott, Wichita, KS (US); John M Lara, Wichita, KS (US)

(73) Assignee: LSI Logic Corporation, Milpitas, CA (US)

( * ) Notice: Subject to any disclaimer, the term of this patent is extended or adjusted under 35 U.S.C. 154(b) by 78 days.

(21) Appl. No.: 10/246,168

(22) Filed: Sep. 18, 2002

(65) Prior Publication Data

US 2004/0054492 A1 Mar. 18, 2004

(51) Int. Cl.$^7$ ................................................ G06F 3/00
(52) U.S. Cl. ...................... 702/120; 702/118; 702/121; 702/122
(58) Field of Search .................. 702/66, 118, 120–122, 702/150; 703/17, 16, 22, 13; 705/412, 7, 10

(56) References Cited

U.S. PATENT DOCUMENTS

| | | | | |
|---|---|---|---|---|
| 4,474,186 A | * | 10/1984 | Ledley et al. | ................ 600/546 |
| 4,578,665 A | * | 3/1986 | Yang | ....................... 246/166.1 |
| 4,807,161 A | * | 2/1989 | Comfort et al. | ............. 702/121 |
| 6,530,054 B2 | * | 3/2003 | Hollander | .................... 714/739 |
| 2003/0043757 A1 | | 3/2003 | White | |

* cited by examiner

Primary Examiner—Marc S. Hoff
Assistant Examiner—Felix Suarez
(74) Attorney, Agent, or Firm—Duft, Setter, Ollila & Bornsen LLC

(57) ABSTRACT

Electrical and mechanical components and associated processes for enhancing automated test of a system by permitting automated generation and application (injection) of real-world stimuli applied to the system under test and sensing responses from the system under test without the need for manual intervention. Test components of the present invention may intercede in the exchange of signals and power over various signaling paths within a system under test. Under programmable control by methods of the invention, the electrical components of the present invention may simulate any desired real-world stimulus on any signal path associated with the system under test. Electromechanical manipulation test components and sensor components allow automation of testing of physical aspects of the system under test. Centralized test sequencing and logic enables simpler test components to permit improved scalability and flexibility of the automated test system and processes.

23 Claims, 2 Drawing Sheets

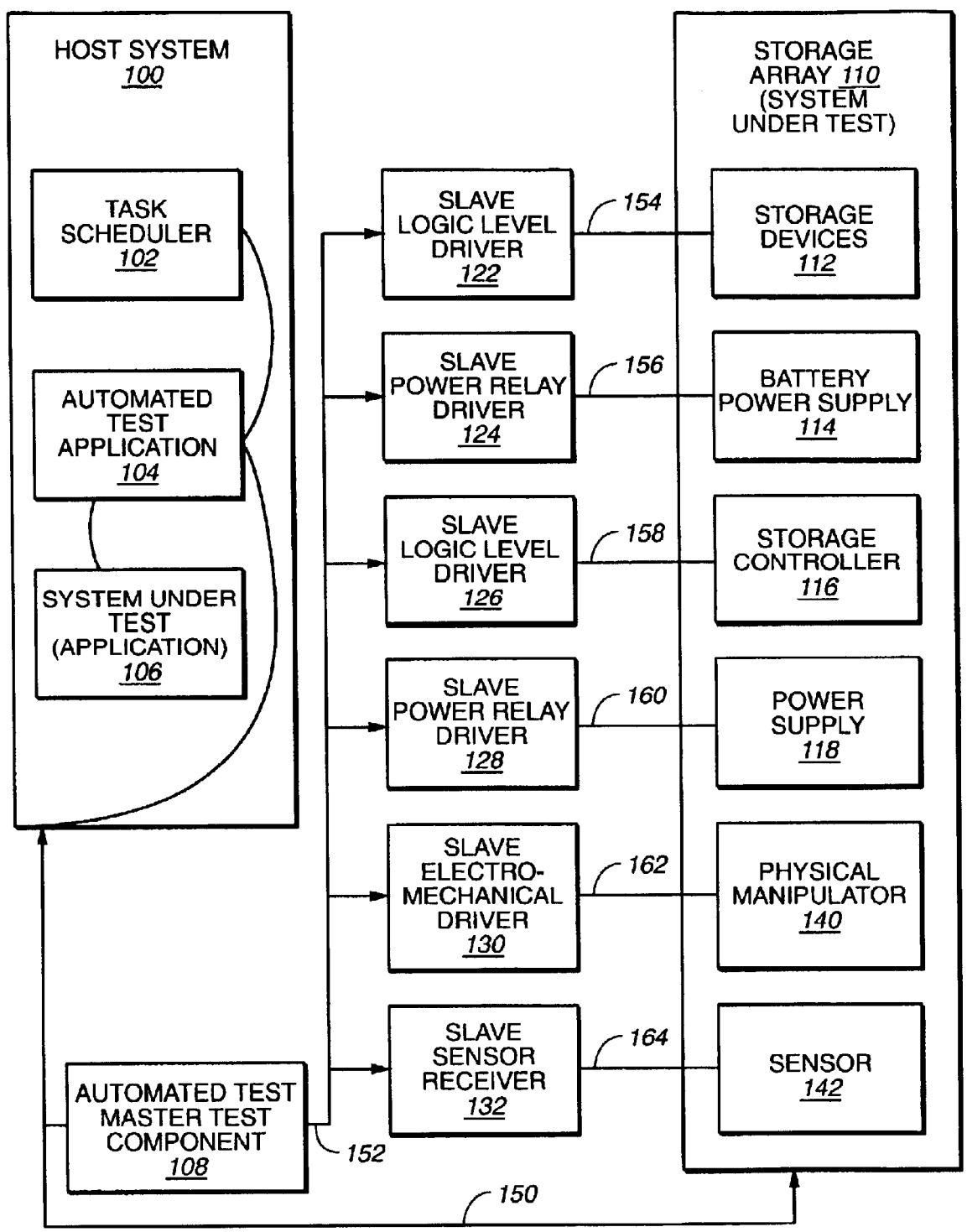
FIG._1

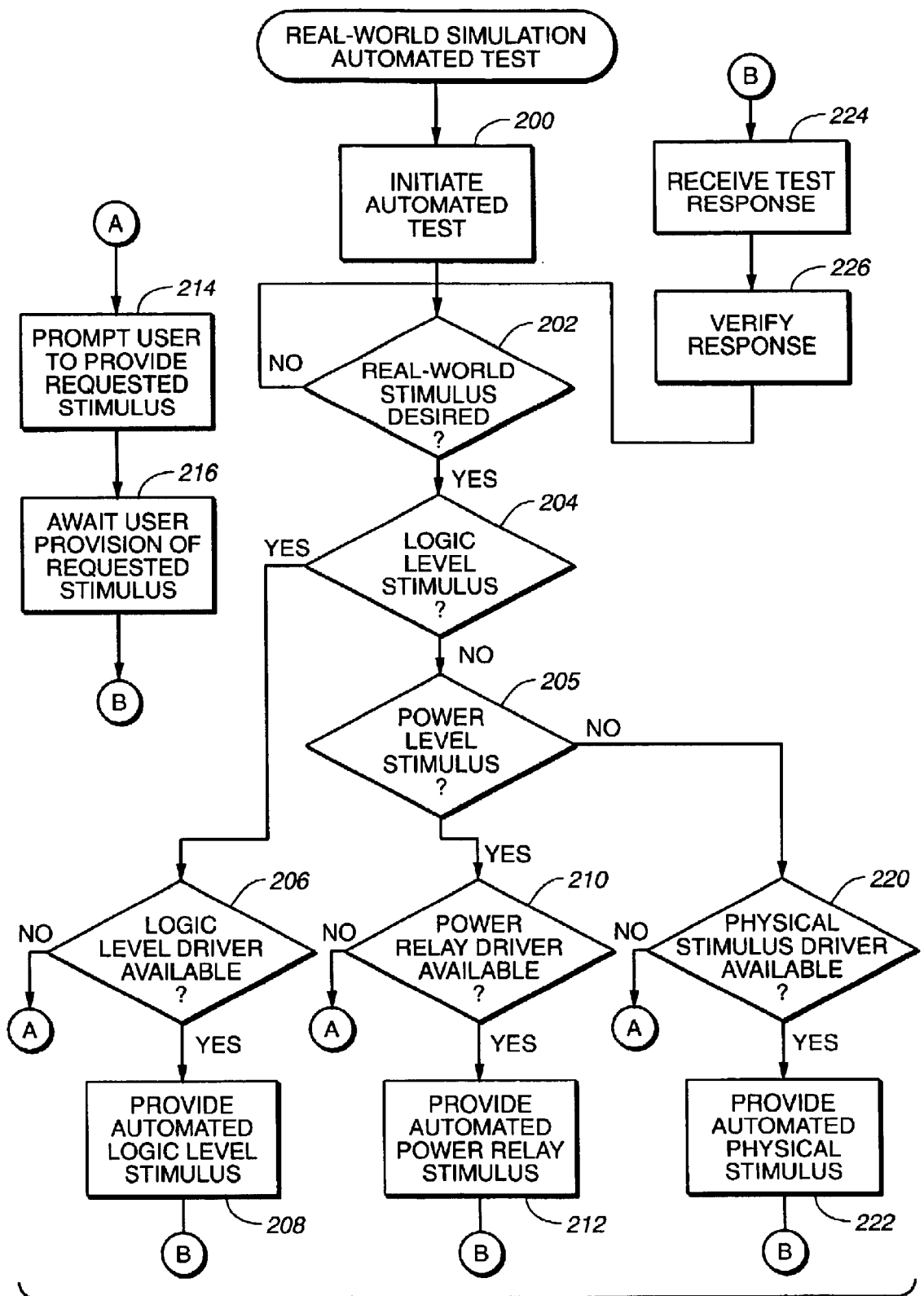
FIG._2

METHODS AND SYSTEMS FOR ENHANCED AUTOMATED SYSTEM TESTING

RELATED APPLICATIONS

This application is related to commonly owned, co-pending U.S. patent application Ser. No. 10/178,135 filed Jul. 24, 2002 which is hereby incorporated by reference.

BACKGROUND OF THE INVENTION

1. Field of the Invention

The invention generally relates to automated testing systems and more specifically relates to methods, circuit structures and systems for improved automated testing of electrical interfaces and physical attributes of systems under test.

2. Discussion of Related Art

In electronic systems it is common for components within a system to be interconnected via electronic signal buses. Signals are exchanged among the various components of a system through such electronic buses. For example, in a computer storage subsystem, a storage controller within the storage subsystem may be coupled to host computers via an I/O interface bus and may be coupled to other components within the storage subsystem via internal electronic signal buses. Further, components within such a storage subsystem may be coupled to power supply signal paths to receive electrical power during normal operation.

In addition, numerous physical connections and indicators may be present in an electronic system. Physical connections between components that may or may not include related electrical connection are common in many systems. Physical indicators may also be present in a system to provide status information to a user of the system. For example, in a storage system, LED or other visual indicators or displays as well as audible alarms may be used to convey physical status information to a user of the system.

When testing such systems in a manufacturing environment it is important to test these various physical connections, interface bus connections, power supply connections and status indicators to verify proper operation of the subsystem in response to various common operating environments and common failure modes. For example, if the operation of a subsystem is specified to behave in a certain respect in response to changes in power status or loss of power, it is important to simulate such a loss of power and verify the proper operation of a system. Or for example, it may be important to verify proper operation of the subsystem in response to sensing connection and disconnection of various components within the subsystem. Still more specifically, with regard to a storage subsystem, it may be important to verify operation of the system in response to power failure, removal or insertion of disk drive storage units, host interface bus failures, and other common failure modes of a storage subsystem. Similarly, it may be important to test for proper operation of the system in response to changes in physical configuration or connectivity of the system and to verify proper operation of the status indicators and displays of the system in response to various modes of operation of the system.

It is also generally known in the art to automate the process of testing manufactured devices by applying external stimuli to the subsystem and verifying proper response of the subsystem in response to the various stimuli. Such automated test systems generally use a computer system programmed with an automated test sequence application. The automated test application follows a sequence of commands to perform certain desired tests on the system under test. The commands may be provided to the test application as, for example, scripts of commands to be interpreted by the test application. The commands instruct the test application to generate sequences of test data for testing normal operation of the system under test. The test application then cooperates with other elements in the host system to communicate the desired test data to the system under test and verifies proper operation of the system under test in response to the generated test data.

In addition to testing proper operation of the subsystem in response to programmable sequences of test data, failure modes as noted above often involve changes to the "real-world" environment in which the system under test is functioning. Simulating such failure modes typically requires manual intervention in the testing process. For example, to verify proper operation of a system under test in response to loss of power, manual intervention is typically required to remove power supplied to the system under test. The test application then verifies proper operation of the system under test in response to the manually generated stimulus. Or, for example, in the case of automated testing of a storage subsystem, manual intervention may be required to remove or insert a disk drive to verify operation of the subsystem in response thereto. Similarly, to test physical connections of components in the system or to verify operation of status indicators and displays, manual intervention is required to provide the desired physical stimuli or to verify operation of the indicators.

It is generally a problem to require manual intervention in a testing process. Manual intervention introduces a probability of human error in the automated testing process and also slows the automated testing process when manual intervention is required. It is also a continuing problem to make automated test systems flexible to adapt to varying real-world stimulus needs of a system under test and scalable to allow for larger number of such required stimuli while maintaining simplicity and associated reduced costs.

It is therefore evident from the above discussion that a need exists for improved automated testing procedures and systems to reduce or eliminate reliance on manual intervention for testing operation of a system in response to "real-world" stimuli and for verification of physical aspects of the system under test including various connections and status indicators.

SUMMARY OF THE INVENTION

The present intervention solves the above and other problems, thereby advancing the state of the useful arts, by providing enhanced systems and methods to automate simulation of "real-world" environmental conditions and to verify response of the system under test in response to such real-world stimuli. Such "real-world" stimuli may include electronic signals within the system under test as well as physical stimuli and status relating to the physical environment and physical connections associated with the system under test.

In general, the present invention provides test components designed to intervene in the normal exchange of signals and power over interface buses and power signal buses within a system under test. Other test components may also be adapted to provide robotic manipulation to alter physical aspects of the system under test and its operating environment. Still others of the test components may provide sensing capabilities to verify proper operation of indicators and displays associated with the system under test.

Test components designed to intervene in the exchange of electronic and power related signals are referred to herein as "switching interfaces." These switching interfaces are coupled through a standard communications interface to the automated testing subsystem operable to perform automated testing on the system under test. The automated testing system is then adapted to command the electrical components to simulate real-world conditions without the need for human intervention. The automated test system may thereby generate real-world stimuli automatically and verify proper operation of the system under test in response thereto.

Robotic manipulation test components may be used by the test application to control physical aspects of the system under test or aspects of the environment in which it operates. Status indicator sensor test components may be used by the test application to verify proper status information is produced by the system under test in response to applied stimuli.

The switching interface test components may possess only minimal processing capability. Rather, they may be implemented as simple receiver components that directly translate received commands to corresponding signals to simulate real-world stimuli impacting the exchange of logic or power signals within the system under test. Similarly, sensing test components may possess only limited processing capability to enable sensing of a type of indicator (i.e., visual or audible) and translation of the sensed indicator to a status message returned to the test application. Still further, robotic manipulation test components need possess only as much processing capability as required to translate commands received from the test application into corresponding physical motion. Well-known "stepper motors" may provide such simple motion while more complex manipulators may provide other physical changes to the system under test.

These enhanced systems and processes of the present invention serve to centralize control of real-world interfaces to be driven by a single test application. Through the communications interface with the enhanced test components, a common software interface may be used by the automated test application to control all real-world interfaces in the automated test sequence. This test architecture therefore allows an automated test application to control all phases of a test sequence including setup of the test environment, verification of the system operation and recovery or cleanup of environmental conditions following the test sequence—all without requiring manual intervention. Eliminating the need for manual intervention also enables continuous (i.e., 24×7) test operation to thereby improve productivity of a test function. Furthermore, this enhanced automated test architecture is easily expandable to test other, previously untested real-world interfaces by providing other variants of switching interface to intercept and inject signals associated with the interfaces and other test components to verify physical aspects of the system under test and operation of status indicators.

BRIEF DESCRIPTION OF THE DRAWINGS

FIG. 1 is a block diagram depicting enhanced automated test features integrated with a system under test in accordance with the present invention.

FIG. 2 is a flowchart describing a method of operation for an automated test system utilizing the enhanced features a FIG. 1

DETAILED DESCRIPTION OF THE PREFERRED EMBODIMENTS

While the invention is susceptible to various modifications and alternative forms, a specific embodiment thereof has been shown by way of example in the drawings and will herein be described in detail. It should be understood, however, that it is not intended to limit the invention to the particular form disclosed, but on the contrary, the invention is to cover all modifications, equivalents, and alternatives falling within the spirit and scope of the invention as defined by the appended claims.

FIG. 1 is a block diagram depicting test component elements integrated with the automated test features of a system for improved automated testing of a system under test 110. System under test 110 may be any type of system that benefits from an automated test capability. Such a system may include a plurality of components within the system interconnected by electrical signaling paths or buses including, for example, logic signal buses and power distribution buses. Further such a system under test 110 may include a number of features that may be physically moved or reconfigured. Still further, such a system under test 110 may include indicators of physical status such as optical or audio status indicators.

As shown in FIG. 1, system under test 110 may be, for example, a storage array subsystem including one or more storage devices 112 electronically coupled to a storage controller 116. Power supply 118 and an optional battery backup power supply 114 both supply electrical power to storage devices 112 and to storage controller 116 via appropriate power distribution buses within the storage array subsystem 110 (system under test 110).

A host computing system 100 is preferably coupled to system under test 110 via communication path 150. A software component 106 within host system 100 provides standard application-specific interaction with the system under test 110. For example, where system under test 110 is a storage array subsystem, system under test application 106 within host system 100 provides standard storage management features for storage and retrieval of information to and from the storage array subsystem.

In a test environment operable within host system 100, automated test application 104 coordinates sequences of operations to be performed to verify proper operation of the system under test 110. Frequently, automated test application 104 is operable to interpret scripts of commands indicating particular sequences of operations to be performed and verified to fully test proper operation of system under test 110. Those of ordinary skill in the art will recognize a variety of programming styles and paradigms that may be used to construct an automated test application 104. Interpretive script processing is therefore intended merely as exemplary of one such of well known automated test application design.

Automated test application 104 may interact with a scheduler component 102 and system under test application 106 to coordinate timing of the desired sequences of commands and to verify proper operation of the system under test 110. In general, automated test application 104 generates a number of stimuli to be applied to the system under test and then verifies proper operation of the system under test in response to application of each such stimulus. As is well known in the art, such stimuli may include sequences of commands, data and status information to be exchanged between host system 100 and system under test 110 via communication path 150.

In addition, as noted above, it is critical in thorough testing of a system under test of that real-world stimuli be applied to the system under test to verify proper operation in response to such real-world environmental stimuli. Examples of such real-world environmental stimuli include removal or application of power signals associated components of the system under test and generation or modification of logic level signals associated with components of the system under test. Such real-world stimuli may also include physical stimuli such as physical removal and insertion of devices within the system under test or simulated operator interaction through the pressing of buttons or other user interaction. As noted above, as presently practiced in the art, such real-world environmental stimuli generally require manual intervention by a human operator. Such human intervention introduces opportunities for errors in the testing procedure and dramatically slows the test process by requiring the otherwise automated test procedure to wait for human interaction to proceed further on a test.

In accordance with the present invention, a master test component 108 is coupled to the host system 100 via path 150 and receives stimulus commands from the automated test application 104 in the host system 100. Master test component 108 decodes the received request for a stimulus and forwards appropriate lower level directives to slave components 122–130 to effectuate application of the desired real-world stimulus to the system under test 110. Slave test components 122 through 128 (also referred to herein as "switching interfaces") may be coupled to bus structures 154 through 160 of system under test 110 to permit interception, generation and injection of signals within system under test 110 via automated testing processes operable within host system 100. Switching interfaces 122 through 128, under control of host system 100 therefore enable automated test processing to include generation of real-world environmental stimuli as simulated signals within the system under test 110 and application of such stimuli to the system under test without the need for manual intervention. More specifically, switching interfaces 122 through 128 are coupled to internal bus structures 154 through 160 of system under test 110 to intercept, generate and inject signals to be exchanged between the various components 112 through 118 of system under test 110. Still more specifically, where system under test 110 is, for example, a storage array subsystem, switching interfaces 122 through 128 may intercept, generate and inject signals exchanged between storage controller 116 and storage devices 112 as well as power supply signals exchanged between power supply 114 or 118 and storage controller 116 and storage devices 112.

In a preferred embodiment, switching interfaces 122 through 128 comprise at least two different forms of switching elements. A first type of switching interface preferably uses standard integrated circuitry and/or discrete electronic components to intercept, generate and inject logic level signals on buses interconnecting components of the system under test (or on buses connecting the system under test with a host system). For example, logic level drivers 122 and 126 are coupled via bus 154 and 158, respectively, to storage devices 112 and storage controller 116, respectively. These logic level drivers 122 and 126 are capable of intercepting, generating and injecting logic level signals to simulate desired stimuli in signals exchanged between, for example, storage controller 116 and storage devices 112.

A second type of switching interface in one preferred embodiment uses power relay switching interfaces to intercept, generate and inject power signals to be applied to devices within system under test 110. For example, as shown in FIG. 1, power relay driver 124 may intercept, generate or inject signals via bus 156 to generate stimuli associated with battery power supply 114. In like manner power relay driver 128 may intercept, generate and inject power signals associated with power supply 118 via bus 160.

Switching interfaces 122 through 128 are preferably coupled via communication path 152 to master test component 108. Automated test application 104 within host system 100 preferably communicates with switching interfaces 122 through 128 in cooperation with master test component 108. Signals exchanged with switching interfaces 122 through 128 via path 152 instruct the switching interfaces regarding the nature and timing of desired stimuli for simulation of changes in real-world environmental aspects of operation of the system under test 110.

Switching interfaces 122 through 128 and associated software control elements operable within host system 100 therefore provide full automation for testing of system under test 110 including the automatic generation of real-world environmental stimuli and verification of operation in response thereto. These features permit fully automated testing of the system under test obviating the need for manual intervention in the performance of particular tests. As noted above, this allows for more accurate test procedures by reducing possibility of human error and also enables nonstop testing procedures devoid of the need for human intervention.

Another form of slave test component is represented as electromechanical driver 130 coupled through path 162 to a physical manipulator 140 associated with the system under test. Such a manipulator 140 (also referred to herein as a "robotic manipulator") effectuates physical changes to the system under test 110. Such physical changes allow a richer set of environmental real-world stimuli to be provided by the automated test system—i.e., physical stimuli may be applied to the system under test. Physical manipulator 140 may be any robotic or physical actuator as appropriate for the particular physical stimulus to be applied. For example, rotary motion such as generated by a servo stepper motor may be applied directly as a physical stimuli (i.e., to turn a knob). Such rotational motion may be translated to linear motion (i.e., to remove a component from the system under test). Straight linear actuators may be applied directly (i.e., to simulate a user pressing a switch or button on the system under test). Numerous equivalent physical stimuli will be readily apparent to those of ordinary skill in the art as will be manipulators and actuators to effect the desired stimulus.

Further, certain applied stimuli may result in changes to physical status indicators on the system under test. For example, an LED or other optical indicator may illuminate in response to certain applied stimuli. Or, for example, an audio alarm indicator may sound in response to certain applied stimuli. Sensor 142 represents a sensor to detect occurrence of such a physical status indicator. Sensor 142 may be any appropriate sensor as well known to those skilled in the art capable of sensing the intended physical status information indicator. Optical and audio sensing may be common examples of such sensors as may be temperature and motion or acceleration sensors.

In one aspect of the invention, slave drivers/receivers 122–128 may be simple devices that merely translate received commands into corresponding signals on paths 154–160, respectively. Master test component 108 may therefore contain the processing capacity to interpret the higher level stimulus and test requests from the test application 104 and determine appropriate slave test components to be addressed to effectuate appropriate signals on paths 154–160. In like manner, slave electromechanical test component 130 may simply translate low level directive received from master test component 108 into corresponding actuator steps or pulses. Higher level processing to determine the desired number or direction of steps to be applied to the manipulator is left to the processing capability of master test component 108. This centralized processing ability of the automated test system simplifies the design of the slave test components to thereby enable improved flexibility and scalability of the system. New slave components for effectuating new electronic or physical stimuli are easily designed. Further, adding simple (hence inexpensive) slave driver devices allows for improved scalability of the test system.

Those of ordinary skill in the art will recognize a variety of equivalent configurations and topologies for the components depicted in FIG. 1. In particular, those of ordinary skill in the art will readily recognize that system under test 110 may be any electronic subsystem having components exchanging logic level signals and/or power signals with another component—typically via a bus structure. Similarly, system under test 110 may be any system having components for which physical stimuli may be applied to effectuate desired tests. The storage array subsystem as shown in FIG. 1 is therefore intended merely as exemplary of a number of such systems. Further, those of ordinary skill in the art will readily recognize that switching elements 122 through 128 are preferably physically positioned and electronically coupled in such a manner as to intercept signals on such buses associated with the system under test. Various forms of cabling and connector techniques well known to those of ordinary skill in the art allow for such a device to be inserted within a signal exchange path of the system under test.

Further, those of ordinary skill in the art will clearly recognize that the particular components shown within host system 100 are merely intended as suggestive of one possible functional decomposition of operating components within the host system. Numerous other functional representations will be apparent to those of ordinary skill in the art. In particular, the functional decomposition of elements shown in automated test system 100 of FIG. 1 are merely intended as exemplary on one possible such decomposition. The functions shown may be combined or divided in numerous other equivalent manners as recognized by those skilled in the art.

Still further, those of ordinary skill in the art will recognize that bus structures 154 through 164 represent any of several well known bus structures commercially available or may represent customized, application-specific bus structures unique to the particular environment. Slave test components 122 through 132 require only that they be positioned physically and electrically as required to allow interception, generation and injection of signals exchanged over the various buses.

Communication path 152 and 150 may be any of several well known to communication media and may use any protocols well known to those of ordinary skill in the art. For example, in one preferred embodiment, communication path 152 may be a simple RS-232 or I12C serial communication line where the interaction between host system 100 and the slave test components 122 through 132 includes a low volume of information. In the alternative where a higher bandwidth communication is required for transferring larger volumes of data, communication path 152 may be a network communication path providing higher speed and higher reliability. In like manner, communication path 150 between host system 100 and system under test 110 may be any well known or custom communication path appropriate to the standard operation of system under test 110 by host system 100. For example, path 150 may be an Ethernet or other network communication path that permits any number of host system to couple to the system under test 110 and to the master test component 108. The master test component 108 may therefore be physically remote from any or all host systems. In the alternative, master test component 108 may be integrated within host system 100 and communicate with the automated test application 104 through standard inter-process communication techniques within the host system 100. Still further, in another alternative embodiment (not shown), communication path 152 may be eliminated and all slave test components 122–132 may be coupled to master test component 108 via path 150 (such as an Ethernet network communication path).

FIG. 2 is a flowchart describing operation of an automated test process utilizing the enhanced features of the present intention to enable automated test processing to include real-world stimulus test procedures. Those skilled in the art will recognize that a test process may be performed requiring manual intervention for generating real-world stimuli as presently practiced in the art or may be performed in a totally automated process, both in accordance with the present invention. In addition, the present invention permits a hybrid approach incorporating both manual processes and fully automated processes to generate real-world stimuli to be applied to a system under test. In essence, a method of the present invention tests a system under test regardless of whether a desired real-world stimulus is available for automated generation and application (i.e., is associated with a corresponding logic level driver or power relay driver element). If an automated stimulus is available, the stimulus is provided by automated means and processes in accordance with the invention. If the requested stimulus is not associated with a corresponding driver element, then manual intervention is required and solicited to generate and apply the real-world stimulus to the system under test. Those skilled in the art will recognize that the invention pertains to provision of such automated test procedures as well as automated procedures combined with such known manual procedures where automated processes are not available.

Element 200 is first operable to initiate the automated test process. Standard automated test processing including script interpretation and execution continues until element 202 detects a requirement for generation of a real-world, environmental stimulus as specified in the automated test process. When such a real-world stimulus request is detected by operation of element 202 (i.e., by processing of a script directive), element 204 next determines whether the requested stimulus is for simulation of a logic level signal. If so, element 206 is next operable to determine whether an appropriate logic level driver switching element is configured for use in simulating the desired real-world stimulus—in other words determining whether the requested signal path is coupled to a logic level driver in the system. If so, element 208 provides the desired automated logic level stimulus by appropriate control of the associated logic level driver. Automated test processing then continues at element 224 to verify proper response of the system under test.

Where element 204 determines that the requested real-world stimulus is not for a logic level signal, element 205 next determines whether the requested stimulus is for simulation of a power level signal. If so, element 210 is next operable to determine whether an appropriate power level driver switching element is configured for use in simulating the desired real-world stimulus—in other words determining whether the requested signal path is coupled to a power level driver in the system. If so, element 212 provides the desired automated power level stimulus by appropriate control of the associated power level driver. Automated test processing then continues at element 224 to verify proper response of the system under test.

Where element 205 determines that the requested real-world stimulus is not for a power level signal, the request is presumed to be for issuance of a physical real-world stimulus. Element 220 is then operable to determine whether an appropriate physical stimulus driver element is configured for use in simulating the desired real-world stimulus—in other words determining whether the requested physical action is coupled to a manipulator in the system. If so, element 222 provides the desired automated physical stimulus by appropriate control of the associated manipulator. Automated test processing then continues at element 224 to verify proper response of the system under test.

If either element 206, element 210 or element 220 determines that no appropriate slave test component is associated with the requested real-world stimulus, processing continues at element 214 to resort to well known manual processing techniques. Specifically, element 214 prompts a human operator to provide the appropriate requested real-world stimulus. Element 216 then awaits an indication from the human user that the requested real-world environmental stimulus has been supplied. Processing then continues at element 224 to verify proper response of the system under test. Elements 214 and 216 therefore provide a mechanism for standard manual processing of the requested real-world stimulus where the enhanced features of the present intention are not available or not configured for use to simulate the requested signal.

Element 224 is operable to await receipt of a response to the real-world stimulus (if any response is expected according to the test application). The expected response depends on the particular real-world stimulus applied and the test application sequence indications of expected responses. If/when such a response is received, element 226 then verifies that the response (if any) is as expected according to the automated test application. The response and any status information relating to the validity of the response may be recorded as appropriate to the test application for further processing.

Those of ordinary skill in the art will readily recognize that in one exemplary application of the features of the present intention, logic signals relating to interaction between a storage controller and storage devices within a storage subsystem may be intercepted and simulated by appropriately configured logic level driver switching elements under control of the process of FIG. 2. For example, simulation of removal or insertion of a disk drive in a storage subsystem under test may be simulated by generation and application (injection) of appropriate signals indicating the presence or absence of a particular disk drive in the subsystem. In like manner, application or removal of power to components of the storage subsystem may be simulated by control of appropriately configured power relay driver switching elements in accordance with the method of FIG. 2. For example, loss of power to a storage controller within a storage subsystem may be simulated by generation and application (injection) of appropriate signals within a power relay driver switching element.

Still further, those of ordinary skill in the art will recognize that the overall sequence and operation of test process depicted in FIG. 2 is merely intended as exemplary of one possible design. Those of ordinary skill in art will readily recognize numerous equivalent sequences and structures for performing automated test sequences on electronic systems under test.

While the invention has been illustrated and described in the drawings and foregoing description, such illustration and description is to be considered as exemplary and not restrictive in character, it being understood that only the preferred embodiment and minor variants thereof have been shown and described and that all changes and modifications that come within the spirit of the invention are desired to be protected.

What is claimed is:

1. Apparatus for automated testing of a system under test, said apparatus comprising:

an automated test application for determining stimuli to be applied to said system under test and for verifying proper operation of said system under test in response to application of said stimuli;

a test master controller coupled to said automated test application for receiving stimulus commands from said automated test system and for generating real-world stimuli corresponding to a received stimulus command; and a slave test component communicatively coupled to said test master controller for applying said real-world stimuli to said system under test wherein the slave test component includes a robotic manipulator for enacting changes of physical attributes of said system under test in accordance with the applied real-world stimuli for testing another physical configuration of said system under test.

2. The apparatus of claim 1 wherein said slave test component comprises: a logic module configured for generating logic signals within said system under test.

3. The apparatus of claim 1 wherein said slave test component comprises:

a power module configured for generating power signals within said system under test.

4. The apparatus of claim 1 wherein said slave test component comprises:

an electromechanical component for enacting physical changes in said system under test and for verifying physical status information provided by said system under test.

5. The apparatus of claim 4 wherein said electromechanical component includes:

a sensor for sensing said physical status information.

6. The apparatus of claim 5 wherein said sensor comprises:

an optical sensor for optically sensing said physical status information.

7. The apparatus of claim 5 wherein said sensor comprises:

an audio sensor for audibly sensing said physical status information.

8. Apparatus for enhanced automated testing of a system under test, said apparatus comprising:

an automated test system for determining stimuli to be applied to said system under test and for verifying proper operation of said system under test in response to application of said stimuli;

a switching interface test component communicatively coupled to said automated test system and coupled to said system under test for controllably applying electronic stimuli of said stimuli as electronic signals to said system under test; and an electromechanical test component communicatively coupled to said automated test system and coupled to said system under test for generating physical stimuli of said stimuli and for applying said physical stimuli to said system under test wherein the electromechanical test components includes a robotic manipulator for enacting changes of physical attributes of said system under test in accordance with the applied physical stimuli for testing another physical configuration of said system under test.

9. The apparatus of claim 8 wherein said electronic stimuli include logic signals and wherein said switching interface test component is operable to apply said logic signals within said system under test.

10. The apparatus of claim 8 wherein said electronic stimuli include power signals and wherein said interface test component is operable to switch said power signals within said system under test.

11. The apparatus of claim 8 wherein said system under test is a storage subsystem including a storage controller, a storage device and an interface bus.

12. The apparatus of claim 8 further comprising:
a sensor communicatively coupled to said automated test system for returning sensed physical status information associated with said system under test.

13. The apparatus of claim 12 wherein said sensor comprises:
an optical sensor for optically sensing said physical status information.

14. The apparatus of claim 12 wherein said sensor comprises:
an audio sensor for audibly sensing said physical status information.

15. A method for testing a system under test comprising the steps of:
determining a real-world stimulus to be applied to said system under test;
automatically generating said real-world stimulus using an automated test system;
automatically applying said real-world stimulus to said system under test using said automated test system without manual intervention wherein the step of automatically applying includes the steps of receiving said stimulus command within said test component: and automatically altering physical attributes associated with said system under test in accordance with said stimulus command; and
automatically verifying proper operation of said system under test in response to application of said real-world stimulus.

16. The method of claim 15 wherein the step of determining includes the step of:
interpreting a test command requesting generation and application of said real-world stimulus.

17. The method of claim 15 wherein the step of automatically generating includes the steps of:
generating a stimulus command to be transmitted to a test component; and
transmitting said stimulus command to said test component.

18. The method of claim 15 wherein the step of automatically applying includes the step of:
receiving said stimulus command within said test component; and
applying a signal to said system under test associated with said stimulus command.

19. The method of claim 18 wherein the step of applying a signal comprises:
applying a logic signal to said system under test to simulate a logic signal stimulus.

20. The method of claim 18 wherein the step of applying a signal comprises:
applying a power signal to said system under test to simulate a power signal stimulus.

21. The method os claim 15 wherein the step of automatically verifying includes the step of:
sensing the state of a physical status information indicator associated with said system under test.

22. The method of claim 21 wherein the step of sensing includes the step of:
sensing an audible physical status information indicator associated with said system under test.

23. The method of claim 21 wherein the step of sensing includes the step of:
sensing a visible physical status information indicator associated with said system under test.

* * * * *